United States Patent
Horng et al.

(10) Patent No.: US 7,672,093 B2
(45) Date of Patent: Mar. 2, 2010

(54) HAFNIUM DOPED CAP AND FREE LAYER FOR MRAM DEVICE

(75) Inventors: Cheng T. Horng, San Jose, CA (US);
Ru-Ying Tong, Los Gatos, CA (US);
Chyu-Jiuh Torng, Pleasanton, CA (US);
Witold Kula, Cupertino, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 599 days.

(21) Appl. No.: 11/582,244

(22) Filed: Oct. 17, 2006

(65) Prior Publication Data

US 2008/0088986 A1   Apr. 17, 2008

(51) Int. Cl.
G11B 5/39 (2006.01)
G11B 5/127 (2006.01)

(52) U.S. Cl. .................................. 360/324.2
(58) Field of Classification Search ................. 257/421; 360/324–324.2
See application file for complete search history.

(56) References Cited

U.S. PATENT DOCUMENTS

| | | | |
|---|---|---|---|
| 6,226,159 B1 | 5/2001 | Pinarbasi | |
| 6,710,987 B2 | 3/2004 | Sun et al. | |
| 6,903,909 B2 | 6/2005 | Sharma et al. | |
| 7,026,673 B2 | 4/2006 | Abraham | |
| 7,067,331 B2 | 6/2006 | Slaughter et al. | |
| 7,072,208 B2 | 7/2006 | Min et al. | |
| 7,122,852 B2 | 10/2006 | Horng et al. | |
| 2002/0054462 A1 | 5/2002 | Sun et al. | |
| 2004/0085681 A1 | 5/2004 | Kai et al. | |
| 2004/0257719 A1 | 12/2004 | Ohba et al. | |
| 2005/0254293 A1 | 11/2005 | Horng et al. | |
| 2005/0276099 A1 | 12/2005 | Horng et al. | |
| 2006/0056114 A1 | 3/2006 | Fukumoto et al. | |
| 2006/0114716 A1 | 6/2006 | Kai et al. | |
| 2006/0119990 A1 | 6/2006 | Nishiyama et al. | |
| 2007/0014149 A1* | 1/2007 | Nagamine et al. | 365/158 |
| 2007/0243638 A1* | 10/2007 | Horng et al. | 438/3 |
| 2008/0023740 A1* | 1/2008 | Horng et al. | 257/295 |
| 2008/0217710 A1* | 9/2008 | Horng et al. | 257/421 |

(Continued)

FOREIGN PATENT DOCUMENTS

EP      1 885 006 A1    2/2008
EP      07392007.60-1215    4/2008

OTHER PUBLICATIONS

"Conceptual material design for magnetic tunneling junction cap layer for high magnetoresistance ratio," by M. Nagamine et al., Journal of Applied Physics 99, 08K703 (2006), pp. 1-3.

(Continued)

*Primary Examiner*—William J Klimowicz
(74) *Attorney, Agent, or Firm*—Saile Ackerman LLC; Stephen B. Ackerman

(57) ABSTRACT

A high performance MTJ, and a process for manufacturing it, are described. A capping layer of NiFeHf is used to getter oxygen out of the free layer, thereby increasing the sharpness of the free layer-tunneling layer interface. The free layer comprises two NiFe layers whose magnetostriction constants are of opposite sign, thereby largely canceling one another.

15 Claims, 1 Drawing Sheet

U.S. PATENT DOCUMENTS

2008/0299679 A1* 12/2008 Zhao et al. .................... 438/3
2009/0108383 A1* 4/2009 Horng et al. ................ 257/421

OTHER PUBLICATIONS

"Continuous thin barriers for low-resistance spin-dependent tunnel junctions," by Jianguo Wang et al., Journal of Applied Physics, vol. 93, umber 10, May 15, 2003, pp. 8367-8369.

"Magnetic tunnel junctions with Hf oxide and modified Hf oxide tunnel barriers," by B. G. Park et al., Journal of Applied Physics, vol. 93, No. 10, May 15, 2003, pp. 6423-6425.

RW. Dave et al., "MgO—based Tunnel Junction Material for High-Speed toggle MRAM", Abstract ED-05, 2005 MMM Conference.

M. Nagamine et al., "Conceptual Material Design for MTJ Cap Layer for High MR Ratio", Abstract ED-10, 50th MMM Conference.

HMG-06-005 to C. Horng et al. "A Novel Method to Form a Non-Magnetic Cap for the NiFe(free) MTJ Stack to Enhance dR/R". U.S. Appl. No. 11/404,446, filed Apr. 14, 2006.

HMG-06-011/12 to C. Horng et al., "A Novel Capping Layer for a Magnetic Tunnel Junction Device to Enhance d R/R and a Method of Making the Same", U.S. Appl. No. 11/496,691, filed Jul. 31, 2006.

M. Chen et al., "Ternary NiFe X as soft biasing film in a magneto-resistive sensor", J. Appl. Phys. 69 (8), Apr. 15, 1991, pp. 5631-5633.

"Eletronegativity" from Answers.com found Apr. 14, 2006, website http://www.answers.com/main/ntquery;jsessionid pp. 1-5.

* cited by examiner

HAFNIUM DOPED CAP AND FREE LAYER FOR MRAM DEVICE

FIELD OF THE INVENTION

The invention relates to the general field of MTJ devices with particular reference to formation of the capping layer.

BACKGROUND OF THE INVENTION

Key to the performance of MTJs (magnetic tunnel junctions) for MRAM (magnetic random access memory) and read heads are: (a) well-controlled magnetization of the pinned layer, large pinning field and high thermal stability, (b) integrity of the tunnel barrier layer, and (c) well-controlled magnetization and switching of the free layer.

For (a), the pinned layer of the MTJ device is typically a SyAF (synthetic antiferromagnetic) layer (e.g. AFM/CoFe/Ru/CoFe). Use of SyAF pinned layer in the MTJ structure not only improves thermal stability but also minimizes the interlayer coupling field (offset field) between the pinned layer and the free layer. For (b), the tunnel barrier commonly used is either a thin layer of amorphous AlOx or crystalline MgO. It has been shown, in the case of a NiFe free layer-MTJ made with amorphous AlOx and crystalline MgO barrier layers is capable of delivering dR/R (magnetoresistive change) more than 40% and 85%, respectively (1, 2). For (c), the free layer for the MRAM-MTJ is best made of a thin permalloy (NiFe) film for its reproducible and reliable switching characteristics (i.e. low switching field (Hc) and switching field uniformity σHc). It is important that the MRAM-MTJ free layer exhibit low magnetostriction $\lambda_s$ (lambda $<1\times10^{-6}$).

The typical cap layer for a conventional MTJ stack is a nonmagnetic conductive metal such as Ta or TaN. The disadvantage of using a Ta capping layer is that, during thermal annealing, Ta diffuses into the NiFe free layer and not only reduces the free layer moment (Bs) but also makes the NiFe free layer very magnetostrictive with a $\lambda s>5\times10^{-6}$ (1). In MRAM application, we found that a high percentage of free layer switching, in Ta capped NiFe-MTJs, is through a vortex structure which results in poor switching field uniformity. To eliminate NiFe/Ta inter-diffusion, the prior art has used Ru to cap the NiFe (free)-MTJ. However, dR/R of the Ru cap MTJ is severely degraded (from 40% to 30%). To reduce NiFe/Ta inter-diffusion while still preserving high dR/R, the NiFe (free)-MTJ can be capped with a Ru/Ta/Ru structure (1). During thermal annealing to fix the pinned layer magnetization direction, the intermediate Ta layer in the tri-layer cap is capable of gettering oxygen atoms in the underlying NiFe free layer. Consequently, the NiFe free layer is less oxygen contaminated and a sharper AlOx/NiFe interface is formed, resulting in an improved dR/R.

A routine search of the prior art was performed with the following references of interest being found:

U.S. Patent Applications 2006/0114716 and 2004/0085681 (Kai et al) teach a composite free layer comprising two layers of NiFe with a layer of Hf in between. U.S. Pat. No. 7,072,208 (Min et al—Headway) shows a free layer of NiFe with a dopant concentration of 1-40% by weight of Hf. U.S. Patent Application 2004/0257719 (Ohba et al) discloses a NiFe—Hf free layer.

U.S. Pat. No. 7,067,331 (Slaughter et al) describes a free layer of CoFeHf. U.S. Patent Application 2006/0119990 (Nishiyama et al) shows a NiFe free layer with Hf aggregated into the crystal grain boundary. U.S. Pat. No. 6,710,987 (Sun et al) discloses NiFe as a free layer alloyed with Cr, Ta, Mo, Nb, or Zr to have low magnetization.

U.S. Pat. No. 7,026,673 (Abraham) shows NiFe free layer alloyed with Ge, B, V, Mb, or Os. This patent teaches the use of "low magnetization materials" for high performance magnetic memory devices. Essentially, an MTJ is made with a thicker free layer of low magnetization materials to improve AQF (array quality factor, defined as Hc/σHc). For a permalloy (NiFe19%) Ms=800 emu/cc, the low magnetization material is preferably a NiFe alloy having Ms less than 600 emu/cc. The low magnetization material comprises a Ni—Fe alloy, including one or more moment reducing elements such as Ge, B, V, Mo, or Os and combinations. Among these elements, only V has an oxidation potential higher than Fe and Ni.

U.S. Pat. No. 6,903,909 (Sharma et al) teaches a NiFe pinned layer to which an amorphizing agent Hf is added. U.S. Patent Application 2006/0056114 (Fukumoto et al) describes a magnetic layer that can be NiFeHf. U.S. Patent Application 2002/0054462 (Sun et al) shows a free layer of NiFe/CoFe with a barrier layer thereover comprising an alloy of Ni and a Hf element.

Additional references of interest included:
1. C. Horng et. al. 2003 Invention disclosure "A novel capping layer for forming high performance MTJ for MRAM application".
2. R W. Dave et. al., "MgO-based tunnel junction material for high-speed toggle MRAM", Abstract ED-05, 2005 MMM conference.
3. M. Nagamine et. al. "Conceptual material design for MTJ cap layer for high MR ratio", abstract ED-10, 50th MMM conference.
4. C. Horng et. al. EMG06-005 "A novel method to form nonmagnetic-NiFeMg cap for the NiFe(free layer)-MTJ to enhance dR/R".
5. C. Homg & R. Tong, EMG06-011 "A novel material to cap the NiFe(free layer)-MTJ to enhance dR/R and method of forming the cap structure", and I-IMG06-16 "A novel material to cap the NiFe(free layer)-MgO-MTJ to enhance dR/R and method of forming the cap structure".
6. M. Chen et. al. "Ternary NiFeX as soft biasing film in a magnetoresistive sensor", J. Appl. Phys, 69. n 5631-33 (1991).
7. U.S. Pat. No. 7,026,673 "Low magnetization materials for high performance magnetic memory devices".

SUMMARY OF THE INVENTION

It has been an object of at least one embodiment of the present invention to improve the dR/R ratio of a MTJ device Another object of at least one embodiment of the present invention has been to render the free layer of said MTJ device free of oxygen contaminants.

Still another object of at least one embodiment of the present invention has been to increase the sharpness of the interface between the tunnel barrier and free layers.

A further object of at least one embodiment of the present invention has been to provide an improved capping structure for said device.

These objects have been achieved by using an MTJ cap layer that is a low-moment NiFeHf/Ta/Ru tri-layer. This layer is a powerful getter for oxygen trapped in the free layer. The relative electrode potentials (electro-negativity) are Hf<Mg<Nb<Zr<Ta . . . <Fe<Ni so a NiFeHf cap is the most powerful for gettering oxygen contaminants from the underlying NiFe free layer.

The NiFeHf cap is formed by co-sputtering NiFe and Hf. Co-sputtered NiFeHf when deposited on silicon oxide is nonmagnetic, but on NiFe it is weakly magnetic. The intrinsic dR/R (i.e. measured at zero biased field) for a NiFeHf cap MTJ is much higher than for a Ru cap MTJ. dR/R measured at 300 mV biased for the NiFeHf cap MTJ has a 30% improvement over that of the standard cap MTJ. $V_{50}$ of the NiFeHf cap MTJ is improved from 650 mV (for Ru cap MTJ) to 750 mV. Also, the error count (EC) for the MRAM array has been drastically reduced

DESCRIPTION OF THE PREFERRED EMBODIMENTS

As discussed above, a capping layer containing tantalum has been shown by the prior art to provide a certain amount of gettering of oxygen in the free layer. Gettering could, however, be even more effective if the oxygen-extracting layer were to be in direct contact to the free layer. This, however, introduces the possibility of alloying between the two layers.

To solve this alloying problem, it is desirable to use a nonmagnetic NiFeX cap (3) that includes a strong oxygen gettering agent X such as Ta. In this way diffusion of element X into the NiFe free layer is greatly reduced. To getter oxygen originating in the NiFe free layer, the X element in the nonmagnetic NiFeX cap should preferably have an oxidation potential higher than Ni and Fe. Thermodynamically, the electrode potential (electronegativity) is Hf<Mg<Nb<Zr<Ta, <V<Fe<Co<Ni.

Figure 1:
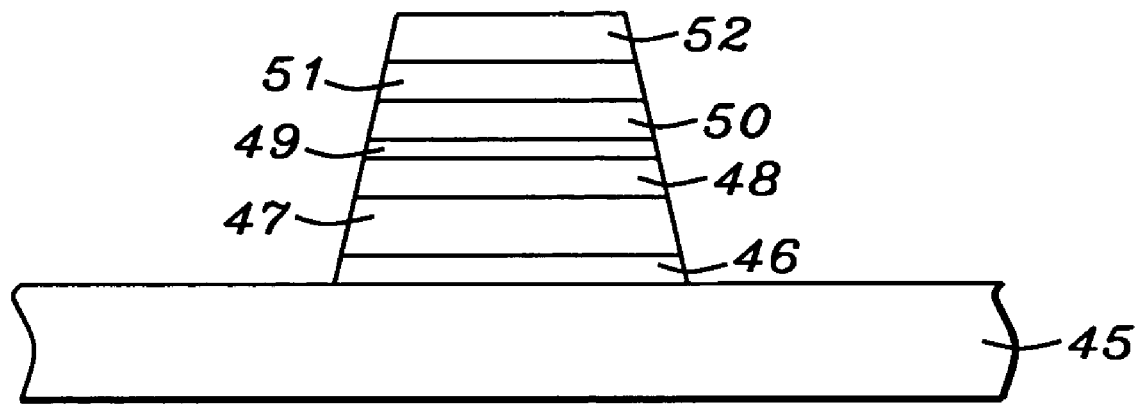
FIG. 1 illustrates the invention for the case of a simple (single) free layer.

In the prior art (1, 3), it has been shown that the MTJ cap layer also plays a critical role in enhancing MRAM performance. We therefore experimented with using various nonmagnetic conductive materials, such as TaN, NiFeMg (4), NiFeZr(5) and NiFeHf (5), to cap the MTJ. Among these cap materials, a NiFeHf cap was found to produce the most significant improvement in dR/R. Accordingly an MTJ manufacturing process that incorporates this material has been engineered and will now be disclosed:

Referring now to FIG. 1, the process of the present invention begins with the provision of suitable substrate 45 that was previously laid down as part of the overall process. Seed layer 46 (which is not part of the invention) is commonly laid down (on this substrate) prior to the deposition thereon of magnetic pinning layer 47.

Magnetically pinned layer (or layers) 48 is then deposited onto layer 47, following which tunneling barrier layer 49 (typically alumina or magnesia) is deposited on layer 48.

Figure 2:
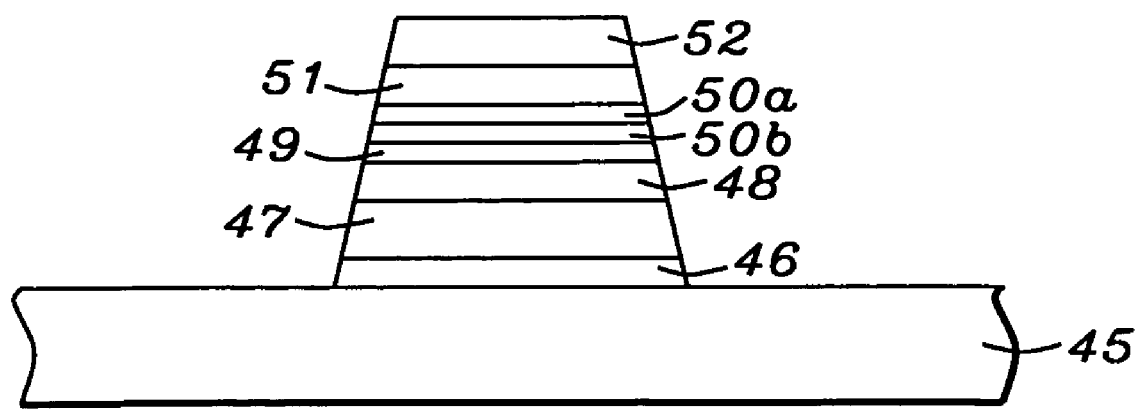
FIG. 2 illustrates the case of a compound (bilayer) free layer.

Next, free layer 50 is deposited onto tunneling barrier layer 49. Layer 50 may be a single layer of NiFe, as shown in FIG. 1, or it may be a composite of two NiFe layers, 50a and 50b, as shown in FIG. 2. In the latter case, layers 50a and 50b are given compositions and thicknesses that result in them having magnetostriction constants of opposite sign so that, when combined they have a very low net magnetostriction constant (typically less than about $1 \times 10^{-6}$).

Next, as a key feature of the invention, a first capping layer 51 of NiFeHf, comprising about 15 atomic % Hf, is deposited onto the free layer (or layers). A second capping layer 52 (of Ru on Ta) is deposited onto first capping layer 51.

The structure is then heated for a time and at a temperature that are sufficient for oxygen trapped in the free layer (or layers) to be gettered by the NiFeHf layer 51 i,e, to diffuse from the free layer into the NiFeHf layer. At the same time some hafnium will diffuse into the free layer(s), as will be discussed in greater detail below. The net result is a sharpening of the interface between the tunnel barrier layer and the free layer(s) which results in a significant improvement in the dR/R performance of the device.

The time and temperature for the above described heating process have typically been for between about 2 and 10 hours at a temperature between about 250 and 280° C.

Experimental: Results and Discussion

The sputter system used was Anelva C-7100-Ex Thin Film Sputtering System (4,5). Nonmagnetic-NiFeHf cap layers were made using a Hf and NiFe cosputtering method. Nonmagnetic-NiFeHf herein refers to thick NiFeHf films deposited on a $SiO_2$/Si substrate that show no magnetic moment. A NiFe(21%) or NiFe(12%) target was used to co-sputter with the Hf target to form [NiFe(21%)]xHf(1−x) or [NiFe(12%) y]Hf(1−y) cap, respectively. In the former, nonmagnetic NiFeHf is formed by co-sputtering NiFe(21%)/Hf using 400 W/200 W power, while the latter was by co-sputtering NiFe (12%)/Hf using 400 W/120 W power.

The composition of the deposited NiFeHf alloy films was analyzed by means of TEM (transmission electron microscopy). The nonmagnetic-NiFe(21%)-Hf alloy was found Ni(56.8 at %)-Fe(15.2 at %)-Hf(28 at %). The nonmagnetic-NiFe(12%)-Hf was Ni(75%)-Fe(10%)-Hf(15%). In the following, the Ni(56.8%)Fe (15.2%-Hf(28%) cap will be referred to as NiFeHf(28%) and Ni(75%)-Fe(10%)-Hf(15%) cap as NiFeHf(15%).

MTJs with the following MTJ stack configuration were made:

Bottom conductor/Buffer layer/Pinned ferromagnetic layer/ AlOX/NiFe(21%) 33(free)/Ni FeHf(28)/Ta30/Ru 100(cap)

The AlOx tunnel barrier layer was formed by ROX (radical oxidation) of 8.25 A-thick Al. For reference, MTJ stack capped POR Ru30/Ta30/Ru100 tri-layer was also made. The deposited MTJ stacks were further processed to have a 280° C.-5 hrs-10 kOe annealing. Magnetic performance properties of the MTJs were measured using CIPT, B-H looper and magnetostriction (lambda) tester. The results are shown in TABLE I:

TABLE I

| Row | Free layer | Capping layer | Bs | $H_c$ | RA, Ω-$\mu m^2$ | dR/R | dR/R gain | lambda |
|---|---|---|---|---|---|---|---|---|
| 1 | NiFe(21%)33 | Ru30/Ta30/Ru100 | 0.614 | 4.55 | 946 | 40.8% | Ref | 1.1E−6 |
| 2 | NiFe(21%)33 | NiFeHf 28% 25/Ta30/Ru100 | 0.760 | 5.91 | 953 | 54.9% | 35% | 7.1E−6 |

As listed in rows 1 and 2 of TABLE I, Bs=0.614 nw (nanoweber) for a 8" wafer was measured for the reference MTJ having a NiFe33 free layer, while Bs=0.76 nw is measured for the NiFeHf(28%) cap NiFe33-MTJ. This is 0.15 nw larger than that of the Ru cap MTJ. This indicates that the 400 W/200 W co-sputtered NiFeHf cap on top of the NiFe free layer is magnetic (as will be confirmed later). Moment (Ms) of 0.15 nw for a 8" wafer amounted to a 8A-thick NiFe(21%) layer. Since the lattice match between the NiFe/NiFeHf layers is better than that between the NiFe/Ru layers, the MTJ moment increase may also come from "reactivation" of a NiFe "dead layer" when Ru is used to cap the NiFe free layer.

As shown in Table I, dR/R of the NiFeHf(28%) cap MTJ is around 55%, while the Ru cap MTJ is 40.8%. The enhancement is 35%, which is a significant improvement. We had implemented this NiFeHf(28%) cap-MTJ as part of a 1 Mbit MRAM chip. As shown in Table I, Hc measured on the NiFeHf cap and Ru-cap MTJ full film stack is, respectively, 5.91 Oe and 4.55 Oe; switching field (Hsw) for the patterned 0.3×0.6 μm² bit in the 1-Mbit MRAM array was measured to be around 100 Oe while the switching field for the reference patterned bit was 37 Oe.

In the 1-Mbit circuit, the maximum write current of 10 mA is not able to switch the NiFeHf-MTJ patterned bit. In the patterned devices, this high switching field is related to the thicker free layer (i.e. Bs). It is noted that high magnetostriction (lambda) is also responsible for the high switching field. In this respect, high magnetostriction of the NiFeHf (28%) cap MTJ may indicate that Hf in the NiFeHf(28%) cap is being diffused, during annealing, into the underlying NiFe (21%) free layer (6). It is noted $V_{50}$ of the NiFeHf(28%) cap MTJ is measured to be around 750 mV, while $V_{50}$ for the reference Ru cap MTJ is around 660 mV.

To solve the magnetostriction problem, a nonmagnetic-NiFeHf cap layer was made by co-sputtering NiFe(12%) and Hf. The composition of this new cap was Ni(75%)-Fe(10%)-Hf(15%) and is designated as NiFeHf(15%). To be compatible with the NiFeHf(15%) cap, the MTJ free layer was changed to a composite free layer made of NiFe(21%)t1/NiFe(12%) t2 or NiFe(17.5%)t3 /NiFe(12%)t4. It is noted that magnetostriction of the NiFe(21%) is positive, while that of NiFe(17.5%) is negative and that of NiFe(12%) is even more negative. Thus, by adjusting the free layer thicknesses t1 and t2 or (t3 and t4), MTJ magnetostriction could be tuned to a very low value (i.e. <1×10-6). Magnetic performance properties for composite NiFe (free)-MTJ capped with NiFeHf (15%) are illustrated in TABLE II.

As shown in Table II, row 2, Bs is 0.68, dR/R=44.5% and lambda is $1.1 \times 10^{-6}$ which is equivalent to the reference device. Again, we had implemented NiFe(21%)10/NiFe (12%)$_{23}$ composite free layer and NiFeHf(15%) cap-MTJ into making 1 Mbit-MRAM chip. The switching field measured for a 0.3×0.6 μm bit has been reduced to around 42 Oe. $V_{50}$ for the NiFeHf(15%) cap MTJ is still high around 750 mV in comparison to 660 my for the reference MTJ. dR/R measured at 300 mV bias is around 27% compared to 21% for the reference MTJ. This amounts to a 29% improvement for MRAM device operation. Rp_cov (i.e. MTJ resistance uniformity) is around 1%, better than that of the Ru cap MTJ. One surprising result for using NiFeHf to cap MTJ free layer was the very low "read" error-count (EC) for the 1-Mbit-chip. Furthermore, the NiFeHf(15%) cap MTJ showed a "write" margin in the full select/half select (FS/HS) test.

Analyses of the 1 Mbit-MRAM-chip indicate that for a $1.0 \times 10^{-6}$ lambda, the MTJ would be better operated for a free layer with Bs around 0.60. It is desirable to have MTJ lambda as low as possible (e.g. $1.0 \times 10^{-7}$) so that a thicker free layer can be used (7) to form high performance MRAM devices.

Using NiFeHf(15%) cap, MTJs with NiFe(17.5%)/NiFe (12%) composite free layer were further made. The results are shown in Table III.

TABLE III

Magnetic performance properties of the composite NiFe(17.5% NiFe(12%)free MTJ stack

| Free layer | capping layer | annealing | Bs | Hc | RA, Ωμm² | dR/R | lambda |
|---|---|---|---|---|---|---|---|
| NiFe(17.5%)8/NiFe(12%)19 | NiFeHf(15%)25/Ta30/Ru100 | 250° C. | 0.62 | 5.10 | 1099 | 47.1 | 1.00E−6 |
| NiFe(17.5%)17/NiFe(12%)16 | NiFeHf(15%)25/Ta30/Ru100 | " | 0.68 | 4.85 | 1083 | 45.9 | 5.43E−7 |
| NiFe(17.5%)38 | Ru30/Ta30/Ru100 | " | 0.68 | 4.55 | 769 | 37.1 | −7.56E−7 |

Comparing Row 2 of Table III to Row2 of Table II, Bs (0.68) of the two MTJs is the same but higher dR/R was obtained for the NiFe(17.5%)/NiFe(12%) MTJ. Magnetostriction measured for the NiFe(17.5%)/NiFe(12%)-MTJ is lower than that of NiFe(21%)/NiFe(12%)-MTJ. In addition to negative lambda NiFe(17.5%), the MTJ's of Table III were annealed at 250° C. so that a lesser amount of Hf is being diffused into the underlying NiFe free layer. For the 1-Mbit-MRAM chip wafers, NiFeHf(15%) cap-MTJ and Ru cap-MTJ with NiFe(17.5%) free layer (i.e. rows 2 and 3) both showed good FS/HS margins. Ru cap NiFe(17.5%)$_{38}$ free-MTJ is the present POR for making the 1-Mbit MRAM chip.

One important characteristic pertinent to the NiFeHf cap-composite NiFe free-MTJ is that dR/R is not so much affected by the interface (i.e. NiFe(17.5%) in TABLE III) NiFe(x) alloy composition. For the reference MTJ, as shown in row 3 of Table II and row 3 of Table III, however, dR/R decreases with decreasing Fe concentration.

TABLE II

Magnetic performance properties of the composite NiFe(21%)NiFe(12%) free MTJ stack

| NiFe free | cap layer | annealing | Bs | Hc | RA, Ωμm² | dR/R | lambda |
|---|---|---|---|---|---|---|---|
| NiFe(21%)8/NiFe(12%)22 | NiFeHf(15%)25/Ta30/Ru100 | 280° C. | 0.64 | 4.86 | 1060 | 46.2 | −9.0E−8 |
| NiFe(21%)10/NiFe(12%)23 | NiFeHf(15%)25/Ta30/Ru100 | " | 0.68 | 4.78 | 1080 | 44.5 | 1.1E−6 |
| NiFe(21%)33 | Ru30/Ta30/Ru100 | " | 0.61 | 4.55 | 852 | 40.0 | 1.1E−7 |

Bs, dR/R and magnetostriction, of the NiFeHf cap MTJ can also be tuned by NiFeHf 15%) cap thickness. These results are shown in TABLE IV:

TABLE IV

Bs, dR/R and magnetostriction as function of NiFeHf(15%) thickness

| NiFe FL | cap | RA | dR/R | Bs | Hc | He | Hk | lambda |
|---|---|---|---|---|---|---|---|---|
| NiFe(21%)8/NiFe(12%)20 | NiFeHf(15%)-25A/Ta/Ru | 1093 | 44.83 | 0.60 | 4.99 | 3.20 | 11.39 | 7.72E−7 |
| " | NiFeHf(15%)-35A/Ta/Ru | 1125 | 47.35 | 0.68 | 4.91 | 2.59 | 11.50 | 1.51E−6 |
| " | NiFeHf(15%)-50A/Ta/Ru | 1174 | 50.98 | 0.72 | 3.74 | 2.92 | 12.11 | 2.61E−6 |

As shown in TABLE IV, three MTJs having the same (composite) NiFe free layer [i.e. NiFe(21%)8/NiFe(12%)22] were made with different NiFeHf(15%) cap thicknesses 25A, 35A and 50A. Bs for the three MTJs was, respectively, 0.60, 0.66 and 0.72. Based on the Bs data, it is noted that the NiFeHf(15%) cap formed on top of NiFe(12%) free layer is magnetic. For a 8" diameter wafer, Bs per Angstrom for the NiFe(21%) is 0.0185 nw/A, 0.0171 nw/A for NiFe(17.5%), and 0.0158 nw/A for NiFe(12%). It is calculated that Bs/A for the NiFeHf(15%) cap is around 0.0055 webers per Angstrom. Thus, the NiFeHf(15%) layer of this invention not only serves as the capping layer to getter oxygen in the underlying free layer it also functions as a part of the free layer. Magnetostriction of this NiFeHf(15%) free layer has a slightly positive value. It is also noted that MTJs made with a thicker NiFeHf (15%) cap yield higher dR/R.

In terms of low magnetization materials, we had worked on making a MTJ with composite NiFe(12%)/NiFeHf(15%) free layer. In this invention the free layer structure, NiFe(12%), is the interface magnetic layer and the top NiFeHf(15%) layer also serves as a cap layer to getter oxygen originating in the underlying NiFe(12%) free layer which results in forming a sharp AlOx/NiFe interface. Table V lists the magnetic performance properties of this low magnetization free layer MTJ.

TABLE V

Magnetic performance properties of NiFe 12% free-MTJ

| Free layer | capping layer | annealing | Bs | Hc | Hin | RA | dR/R | lambda |
|---|---|---|---|---|---|---|---|---|
| NiFe(12%)27 | NiFeHf(15%)40/Ta30/Ru100 | 250° C. | 0.64 | 4.98 | 2.84 | 1035 | 45.1 | −1.58E−7 |
| NiFe(12%)27 | NiFeHf(15%)45/Ta30/Ru100 | " | 0.67 | 4.98 | 2.76 | 1035 | 47.9 | 1.70E−7 |
| NiFe(12%)38 | Ru30/Ta30/Ru100 | 280° C. | 0.72 | 4.56 | 2.29 | 836 | 33.0 | −6.57E−6 |

As can be seen in row 2 of TABLE V, the MTJ free layer comprising NiFe(12%)27 and NiFeHf(15%)45 has a total thickness equal to 72 Angstroms. The average Bs/Angstrom is calculated to be 0.67/72=0.009 nw/Angstrom. This amounts to a 53% of NiFe(17.5%), therein Bs/A is 0.0171 nw/Angstrom. dR/R for this low magnetization/low magnetostriction free layer-MTJ is 47.1%, even higher than the NiFeHf(15%) cap MTJs made with NiFe(21%) or NiFe (17.5%) interface layer.

In principle, dR/R is governed by the spin polarization of the interface magnetic layer such as NiFe(21%), NiFe (17.5%) or NiFe(12%) (present invention). In the case of a NiFe magnetic layer, spin polarization is increased with increasing Fe content. Thus, NiFe having higher Fe content is expected to have higher spin polarization, thereby yielding higher dR/R. From this new cap experiment, it turns out that a sharp AlOx/NiFe interface (resulting from cap gettering) is even more powerful than high polarization for maximizing dR/R.

What is claimed is:

1. A process for the manufacture of an MTJ device, that includes a free layer having a magnetic moment, comprising:

providing a substrate and depositing thereon a magnetic pinning layer;

depositing a magnetically pinned layer on said pinning layer;

depositing a tunnel barrier layer on said pinned layer;

depositing on said tunnel barrier layer a composite free layer comprising first and second layers of NiFe whose magnetostriction constants are of opposite sign, thereby canceling one another;

depositing on said composite free layer a first cap layer of NiFeHf;

depositing on said first cap layer a second cap layer of Ru on Ta; and then heating said device for a time and at a temperature that are sufficient for oxygen trapped in said composite NiFe layer to diffuse into said NiFeHf layer, thereby sharpening an interface between said tunnel barrier layer and said composite free layer.

2. The process described in claim 1 wherein said first NiFe layer comprises between about 17.5 and 21 atomic percent Fe and said second NiFe layer comprises about 12 atomic percent Fe.

3. The process described in claim 1 wherein said first NiFe layer is deposited to a thickness between about 5 and 20 Angstroms and said second NiFe layer is deposited to a thickness between about 10 and 30 Angstroms.

4. The process described in claim 1 wherein said first NiFe layer comprises about 12 atomic percent Fe and said second layer is NiFeHf(15%).

5. The process described in claim 4 wherein said first NiFe layer is deposited to a thickness between 20 and 30 Angstroms and said second NiFeHf layer is deposited to a thickness between 25 and 50 Angstroms.

6. The process described in claim 4 wherein said composite free layer has a magnetostriction value less than about $2 \times 10^{-6}$.

7. The process described in claim 4 wherein said MTJ device has a dR/R value of at least 40%.

8. An MTJ device, that includes a free layer having a magnetic moment comprising:
- a magnetic pinning layer on a substrate;
- a magnetically pinned layer on said pinning layer;
- a tunnel barrier layer on said pinned layer;
- on said tunnel barrier layer, a composite free layer comprising first and second layers of NiFe whose magnetostriction constants are of opposite sign;
- on said composite free layer, a first cap layer of NiFeHf; and
- on said first cap layer, a second cap layer of ruthenium on tantalum.

9. The MTJ device described in claim 8 wherein said NiFeHf layer contains about 15 or less atomic percent of hafnium.

10. The MTJ device described in claim 8 wherein said tunnel barrier layer is selected from the group consisting of AlOx, MgO, AlHfOx, AlTiOx, and TiOx.

11. The MTJ device described in claim 8 wherein said first NiFe layer comprises about 17.5 atomic percent Fe and said second NiFe layer comprises about 12 or less atomic percent Fe.

12. The MTJ device described in claim 8 wherein said first NiFe layer has a thickness between about 5 and 20 Angstroms and said second NiFe layer has a thickness between about 10 and 30 Angstroms.

13. The MTJ device described in claim 12 wherein said composite free layer has a magnetostriction constant that is less than about $2 \times 10^{-6}$.

14. The MTJ device described in claim 12 wherein said MTJ device has a dR/R value of at least 40%.

15. An MTJ device whose free layer is a bilayer of $Ni_{88}Fe_{12}$, between 20 and 30 Angstroms thick, and $(NiFe)_{85}Hf_{15}$, about 45 Angstroms thick, whereby said MTJ device has a dR/R ratio greater than 47%.

* * * * *